(12) United States Patent
Kawano (10) Patent No.: US 10,038,449 B2
(45) Date of Patent: Jul. 31, 2018

(54) TEMPERATURE COMPENSATION CIRCUIT AND RADAR APPARATUS

(71) Applicant: FUJITSU LIMITED, Kawasaki-shi, Kanagawa (JP)

(72) Inventor: Yoichi Kawano, Setagaya (JP)

(73) Assignee: FUJITSU LIMITED, Kawasaki (JP)

(*) Notice: Subject to any disclaimer, the term of this patent is extended or adjusted under 35 U.S.C. 154(b) by 349 days.

(21) Appl. No.: 15/099,951

(22) Filed: Apr. 15, 2016

(65) Prior Publication Data

US 2016/0344393 A1 Nov. 24, 2016

(30) Foreign Application Priority Data

May 18, 2015 (JP) .................. 2015-100910

(51) Int. Cl.
*H03L 1/02* (2006.01)
*G01S 7/35* (2006.01)

(52) U.S. Cl.
CPC ............... *H03L 1/02* (2013.01); *G01S 7/352* (2013.01)

(58) Field of Classification Search
CPC .................................. G01S 7/352; H03L 1/02
USPC ....................................................... 342/175
See application file for complete search history.

(56) References Cited

U.S. PATENT DOCUMENTS

| 2009/0184777 A1 | 7/2009 | Fagg et al. |
| 2011/0226067 A1 | 9/2011 | Bessho |
| 2015/0155907 A1* | 6/2015 | Shen .................... H04B 1/0475 375/297 |

FOREIGN PATENT DOCUMENTS

| JP | 2010-147758 | 7/2010 |
| JP | 2010-524335 | 7/2010 |

* cited by examiner

*Primary Examiner* — Timothy A Brainard
(74) *Attorney, Agent, or Firm* — Fujitsu Patent Center (57) ABSTRACT

A temperature compensation circuit includes: an oscillation circuit configured to include a replica amplifier of a target amplifier to be subjected to temperature compensation and oscillate by feeding an output of the replica amplifier back to an input; a time measurement circuit configured to measure a measured rise time taken from a start of oscillation of the oscillation circuit until an amplitude of an oscillation signal reaches a specific amplitude in the oscillation circuit; and a control circuit configured to compare a reference rise time of the oscillation circuit measured under a reference condition and the measured rise time and change a driving condition of the replica amplifier such that the measured rise time becomes substantially equal to the reference rise time.

18 Claims, 11 Drawing Sheets

TEMPERATURE COMPENSATION CIRCUIT AND RADAR APPARATUS

CROSS-REFERENCE TO RELATED APPLICATION

This application is based upon and claims the benefit of priority of the prior Japanese Patent Application No. 2015-100910, filed on May 18, 2015, the entire contents of which are incorporated herein by reference.

FIELD

The embodiment discussed herein is related to a temperature compensation circuit and a radar apparatus.

BACKGROUND

Radio communication and radar apparatuses using millimeter waves have been developed.

The related art is disclosed in Japanese Laid-open Patent Publication No. 2010-147758 or Japanese National Publication of International Patent Application No. 2010-524335.

SUMMARY

According to an aspect of the embodiments, a temperature compensation circuit includes: an oscillation circuit configured to include a replica amplifier of a target amplifier to be subjected to temperature compensation and oscillate by feeding an output of the replica amplifier back to an input; a time measurement circuit configured to measure a measured rise time taken from a start of oscillation of the oscillation circuit until an amplitude of an oscillation signal reaches a specific amplitude in the oscillation circuit; and a control circuit configured to compare a reference rise time of the oscillation circuit measured under a reference condition and the measured rise time and change a driving condition of the replica amplifier such that the measured rise time becomes substantially equal to the reference rise time.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

An amplifier is used as a basic circuit of a millimeter-wave circuit. The gain of the amplifier changes with the outside temperature thereof. For example, when the gain of the amplifier is lowered due to a high temperature, the output power of a transmitter is lowered. In the case of a radar apparatus, when the transmission power thereof decreases, a remote target may not be detected. For this reason, in a device with millimeter waves applied, a temperature compensation circuit in which the gain of the amplifier is maintained stable against temperature change may be provided.

The amplifier has a high gain in a predetermined frequency range. With the same frequency, the gain is high at a room temperature (or a low temperature) and low at a high temperature. This change of the gain due to the temperature is caused by lowering of the mutual conductance of a transistor forming the amplifier. For this reason, in temperature compensation, a control action is taken in which a gate-source voltage Vgs (hereinafter, referred to as a gate voltage) is lowered to lower the mutual conductance at a room temperature, and when the temperature becomes high and the mutual conductance starts to fall, the gate voltage is increased.

For example, in order to perform this control at any time, a thermometer is embedded in a chip. The relation between a temperature measured in advance and a gate bias, which are associated in 1:1 ratio, is stored in an internal memory. The gate bias corresponding to the measured temperature is read, whereby setting of the gate bias is performed. Change of the gate bias changes the gate voltage and thus changes the gain of the amplifier.

For example, at the time of shipment of the product, data corresponding to each temperature within an operation guaranteed temperature range is acquired, the temperatures and the gains (gate biases) of the amplifier are associated in 1:1 ratio, and the associated relations are stored in the internal memory. This arrangement may complicate the inspection at shipment. For example, because the acquisition process of the data corresponding to each temperature within the operation guaranteed temperature range is complicated, the production cost may be increased.

Figure 1A:
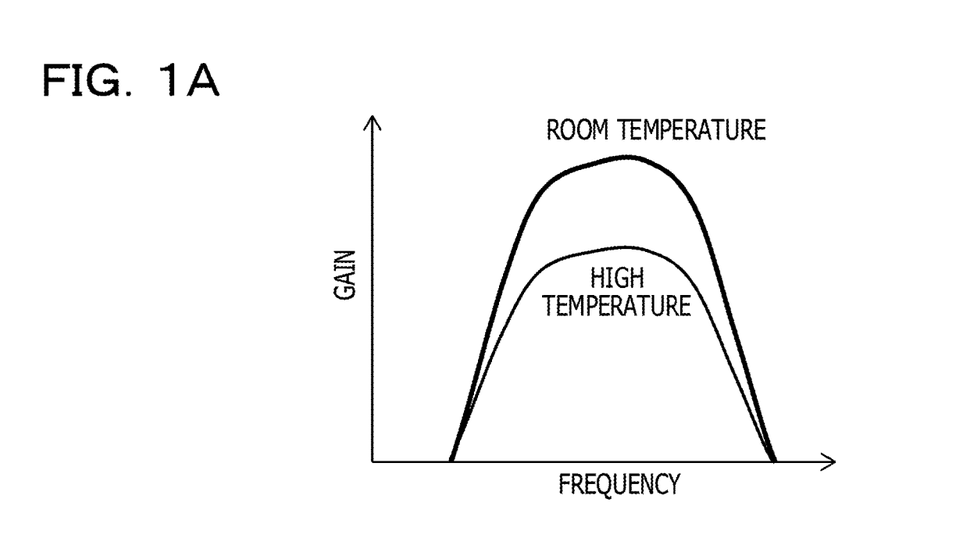
FIGS. 1A and 1B illustrate examples of temperature compensation of an amplifier.
Figure 1B:
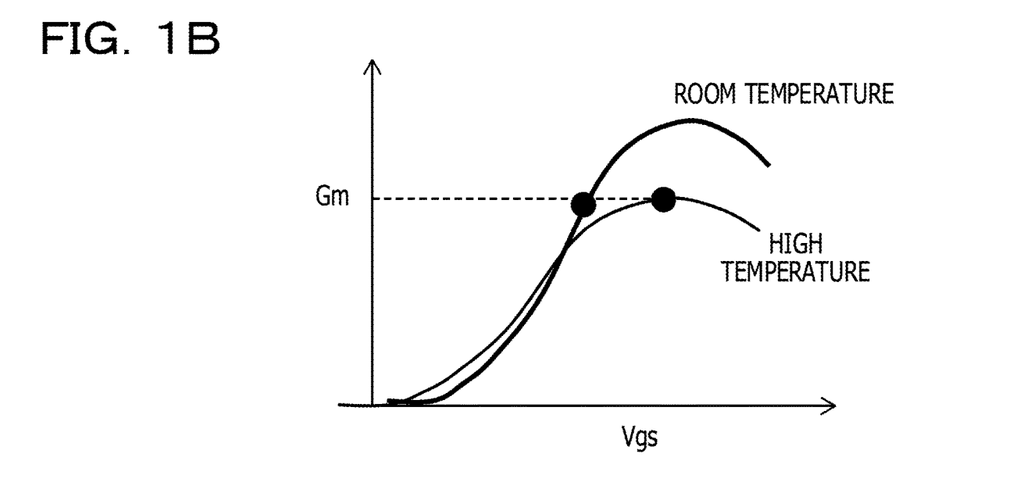

FIGS. 1A and 1B illustrate examples of temperature compensation of the amplifier. FIG. 1A illustrates relations between frequencies and gains at room temperatures and at high temperatures. FIG. 1B illustrates relations between gate-source voltages Vgs (hereinafter, referred to as gate voltages) and mutual conductances Gm of a transistor at room temperatures and high temperatures.

As illustrated in FIG. 1A, the gain is high at a room temperature but is lowered at a high temperature. This lowering is caused by lowering of the mutual conductance Gm of the transistor forming the amplifier, as illustrated in FIG. 1B. For this reason, in temperature compensation, control is performed in which Vgs is lowered to lower Gm at a room temperature, and when the temperature becomes high and the Gm starts to fall, the Vgs is increased for the Gm to be the same.

Figure 2:
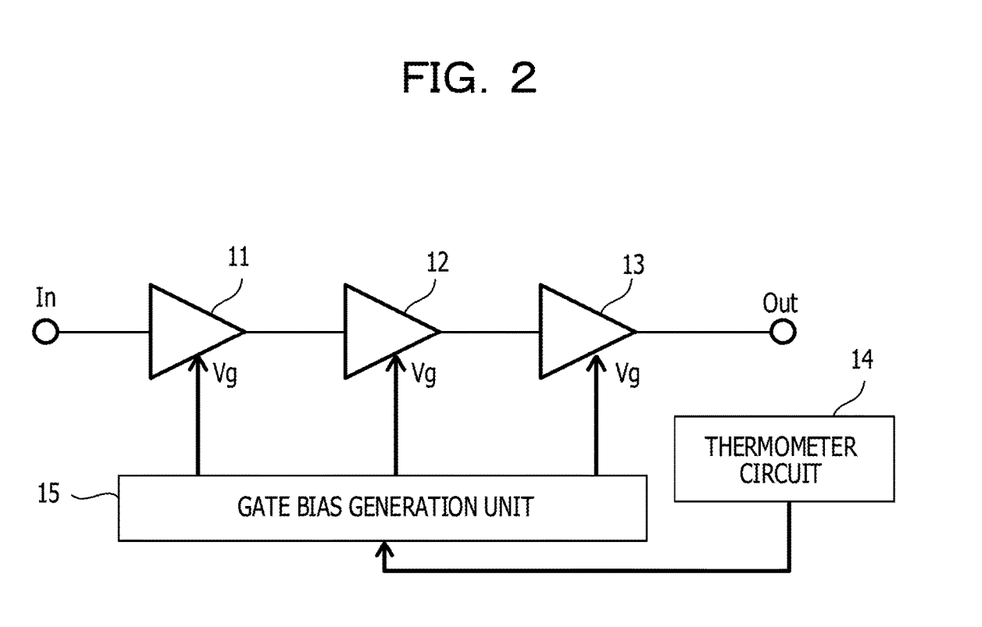
FIG. 2 illustrates an example of an amplifier and a temperature compensation circuit.

FIG. 2 illustrates an example of an amplifier and a temperature compensation circuit. In the amplifier illustrated in FIG. 2, amplification stages 11 to 13 including a transistor are connected in series in three stages. The amplifier receives an input In and outputs an output Out that has been amplified. The temperature compensation circuit includes a thermometer circuit 14 embedded in a chip and a gate bias generation unit 15.

The amplification stages 11 to 13 includes a transistor, and an input signal is applied to the gate of the transistor. The input In may be a modulated signal, and the gate voltage of the transistor changes in accordance with the signal. The gate bias is a level indicating the base of the signal applied to the gate and the gate voltage of the transistor is to be a signal obtained by adding the input signal to the gate bias. Accordingly, in accordance with change of the gate bias, the level of the signal applied to the gate, for example, the gate voltage changes.

The thermometer circuit 14 reads the temperature of the chip and the gate bias generation unit 15 changes the gate biases Vg of the transistors included in the amplification stages 11 to 13 in accordance with the temperature of the chip, whereby the gain of the amplifier is controlled to be stable.

For the control in the temperature compensation circuit in FIG. 2, the relation between the chip temperature detected by the thermometer circuit 14 and the gain of the amplifier, for example, the relation between the chip temperature and the gate bias Vg that enables a stable gain is acquired in advance, and the acquired relation is stored. For example, the gate bias generation unit 15 includes a non-volatile memory storing therein the relation between the chip temperature and the gate bias Vg in a manner associated in 1:1 ratio and reads, from the non-volatile memory, the gate bias Vg corresponding to the acquired chip temperature for setting.

The relation between the chip temperature and the gate bias Vg is maintained at each temperature within the operation guaranteed temperature range of the chip at the time of shipment of the product, the corresponding data (gate bias Vg) is measured at each temperature, and the measured data is stored in the non-volatile memory. This measurement operation complicates the inspection at shipment. For example, it takes expensive equipment and a lot of times to obtain each temperature within the operation guaranteed temperature range of the chip. This may increase the inspection cost.

For example, a temperature compensation circuit may be provided in which the relation between the temperature and the gate bias is not measured at every temperature within the operation guaranteed temperature range and measurement is performed only at the room temperature, so that other temperatures are compensated.

Figure 3:
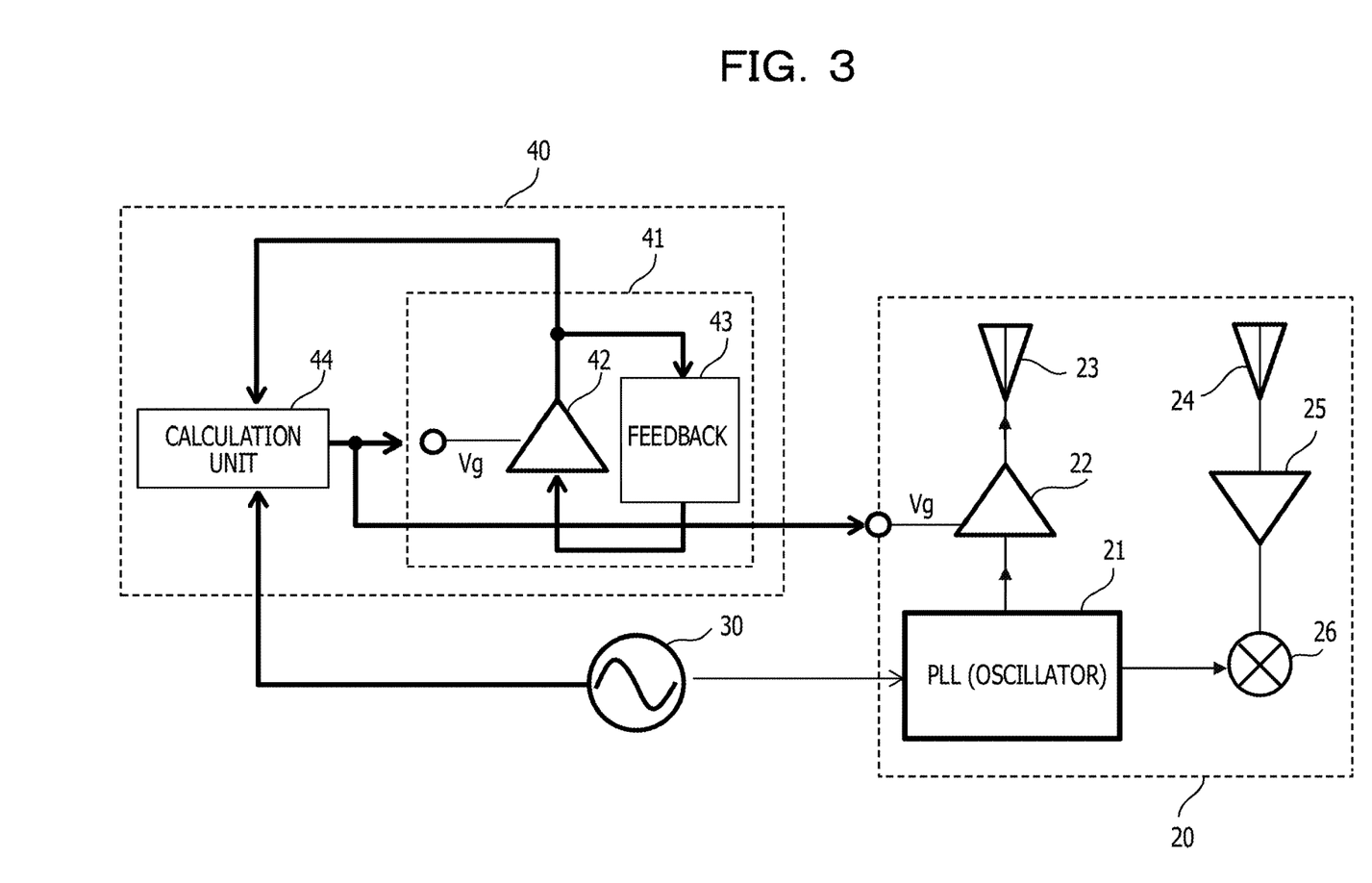
FIG. 3 illustrates an example of a circuit performing temperature compensation of a transmission amplifier.

FIG. 3 illustrates an example of a circuit performing temperature compensation of a transmission amplifier. In FIG. 3, the above-described temperature compensation circuit is applied to a circuit performing temperature compensation of the transmission amplifier in a transceiver of the radar apparatus.

The radar apparatus includes a transceiver 20, a reference oscillator 30, and a temperature compensation circuit 40. The reference oscillator 30 generates an oscillation signal at a substantially fixed frequency regardless of operation conditions such as the temperature, and includes a temperature-compensated crystal oscillator, for example. The reference oscillator 30 is used for stabilizing the frequency of a PLL 21 in the transceiver 20.

The transceiver 20 includes the PLL (oscillator) 21, a transmission amplifier 22, a transmission antenna 23, a reception antenna 24, a reception amplifier 25, and a mixer 26. The PLL 21 multiples an oscillation signal at a fixed frequency that is output from the reference oscillator 30 to generate a high-frequency oscillation signal. For example, the oscillation signal generated by the reference oscillator 30 may be an oscillation signal of 10 MHz, and a high-frequency oscillation signal generated by the PLL 21 may be an oscillation signal of several tens of GHz. For example, the PLL 21 includes a modulator that modulates a high-frequency oscillator signal and outputs the modulated high-frequency oscillator signal to the transmission amplifier 22 and the mixer 26.

The transmission amplifier 22 includes a transistor, and amplifies the modulated high-frequency oscillation signal output from the PLL 21 and outputs the amplified signal to the transmission antenna 23. The modulated high-frequency oscillation signal is sent out from the transmission antenna 23. The transmission amplifier 22 is the target for the temperature compensation performed by the temperature compensation circuit 40. The modulated high-frequency oscillation signal sent out from the transmission antenna 23 and reflected by an object is captured by the reception antenna 24, amplified by the reception amplifier 25, mixed with the modulated high-frequency oscillation signal from the PLL 21 at the mixer 26, whereby an intermediate frequency signal is generated. The intermediate frequency signal receives baseband signal processing in a circuit within the radar apparatus and information such as presence or absence of an object within the radio wave transmission range from the transmission antenna 23 and the distance to the object is generated.

The temperature compensation circuit 40 includes an oscillation circuit 41 and a calculation unit 44. The oscillation circuit 41 includes a replica amplifier 42 having a structure substantially the same or similar to the transmission amplifier 22 and a feedback path 43 feeding an output from the replica amplifier 42 back to an input to the replica amplifier 42, and generates an oscillation signal. For example, a signal in the reverse phase to (inverted from) the output is fed back to the amplifier, whereby an oscillation circuit is formed. With a high-speed amplifier, an output is fed back thereto as is, whereby an oscillation circuit is formed. In the oscillation circuit 41, an oscillation circuit may be formed with an output from the replica amplifier 42 fed back to an input and may be formed in other methods. As a replica, a replica having a smaller size may be used. Because the temperature characteristics of the amplifier may slightly vary when the size thereof is different, the replica amplifier 42 may have a structure, including the size, that is substantially the same as that of the transmission amplifier 22. For example, when differences in temperature characteristics caused by the difference in size are acceptable, the size may be different.

The gate biases Vg of transistors included in the transmission amplifier 22 and the replica amplifier 42 are set by the calculation unit 44 and the set gate biases Vg are changeable. By changing the gate biases Vg of the transistors included in the transmission amplifier 22 and the replica amplifier 42, the gains of the transmission amplifier 22 and the replica amplifier 42 are changed.

The calculation unit 44 receives an oscillation signal from the oscillation circuit 41 and measures a change in the oscillation signal generated after the operation start of the oscillation circuit 41, for example, the time taken until the amplification of the oscillation signal reaches a predetermined level, by using a clock generated from an oscillation signal at a fixed frequency that is output from the oscillation circuit 41. The time taken until the amplification of the oscillation signal reaches a predetermined level after the operation start may be referred to as a rise time. The calculation unit 44 measures a rise time of the oscillation circuit under reference conditions (for example, at a room temperature of 20° C.) and stores the measured time as a reference rise time in a non-volatile memory, for example. The calculation unit 44 compares a measured rise time that has been measured with the reference rise time, and changes the gate bias Vg such that the measured rise time becomes equal to the reference rise time. At this time, the gains of the transmission amplifier 22 and the replica amplifier 42 may be substantially the same as the gain under the reference conditions.

Figure 4:
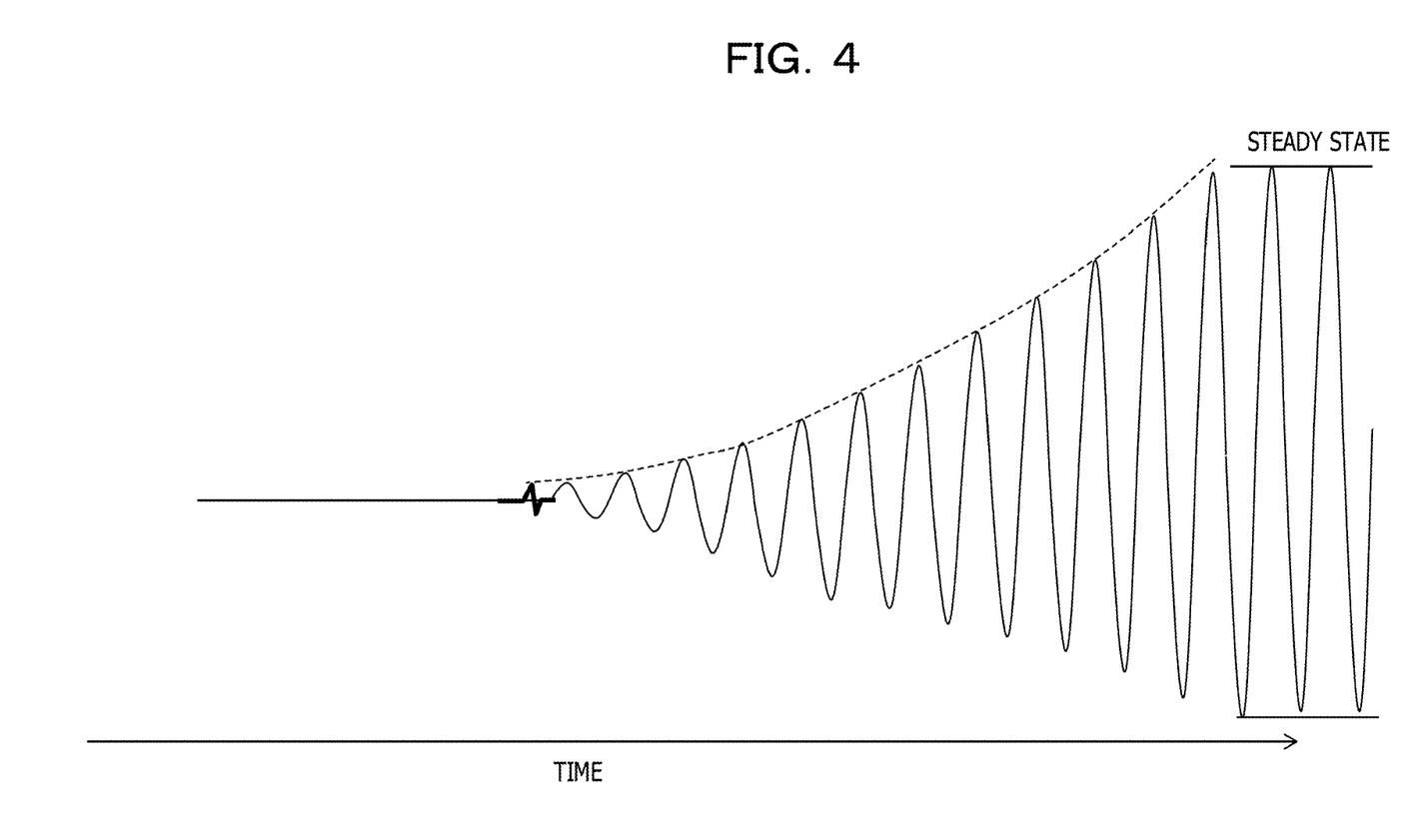
FIG. 4 illustrates an example of a state of an oscillation circuit.

FIG. 4 illustrates an example of a state of an oscillation circuit. FIG. 4 illustrates the oscillation circuit 41 from a no oscillation state to a state in which an oscillation signal has grown to be in a steady state. As illustrated in FIG. 4, the amplitude of the signal grows in accordance with a loop gain (the gain of the replica amplifier 42) G as the oscillation outputs are repeated over a number of cycles from the no oscillation state, and after a certain number of cycles, the signal reaches a steady state in which the signal has a stable amplitude. A rise time that is taken until the oscillation amplitude has grown and the signal reaches the steady state is measured. The rise time is related to the loop gain G. With substantially the same rise times, the loop gains G may be substantially equal. For this reason, the calculation unit 44 measures the rise time of the oscillation circuit 41 and adjusts the gate bias Vg such that the measured rise time becomes substantially equal to the reference rise time. When the adjustment is completed, the loop gain G of the oscillation circuit 41 is substantially equal to the loop gain under the reference conditions (for example, at a room temperature of 20° C.). For example, the gain of the replica amplifier 42 is substantially equal to the gain under the reference conditions (for example, at a room temperature of 20° C.). The calculation unit 44 sets the gate bias Vg at this time as the gate bias of the transistor included in the transmission amplifier 22, and the gain of the transmission amplifier 22 thus is the gain under the reference conditions. From the transmission amplifier 22, a modulated high-frequency oscillation signal with a predetermined strength assumed at the time of design is output.

Figure 5:
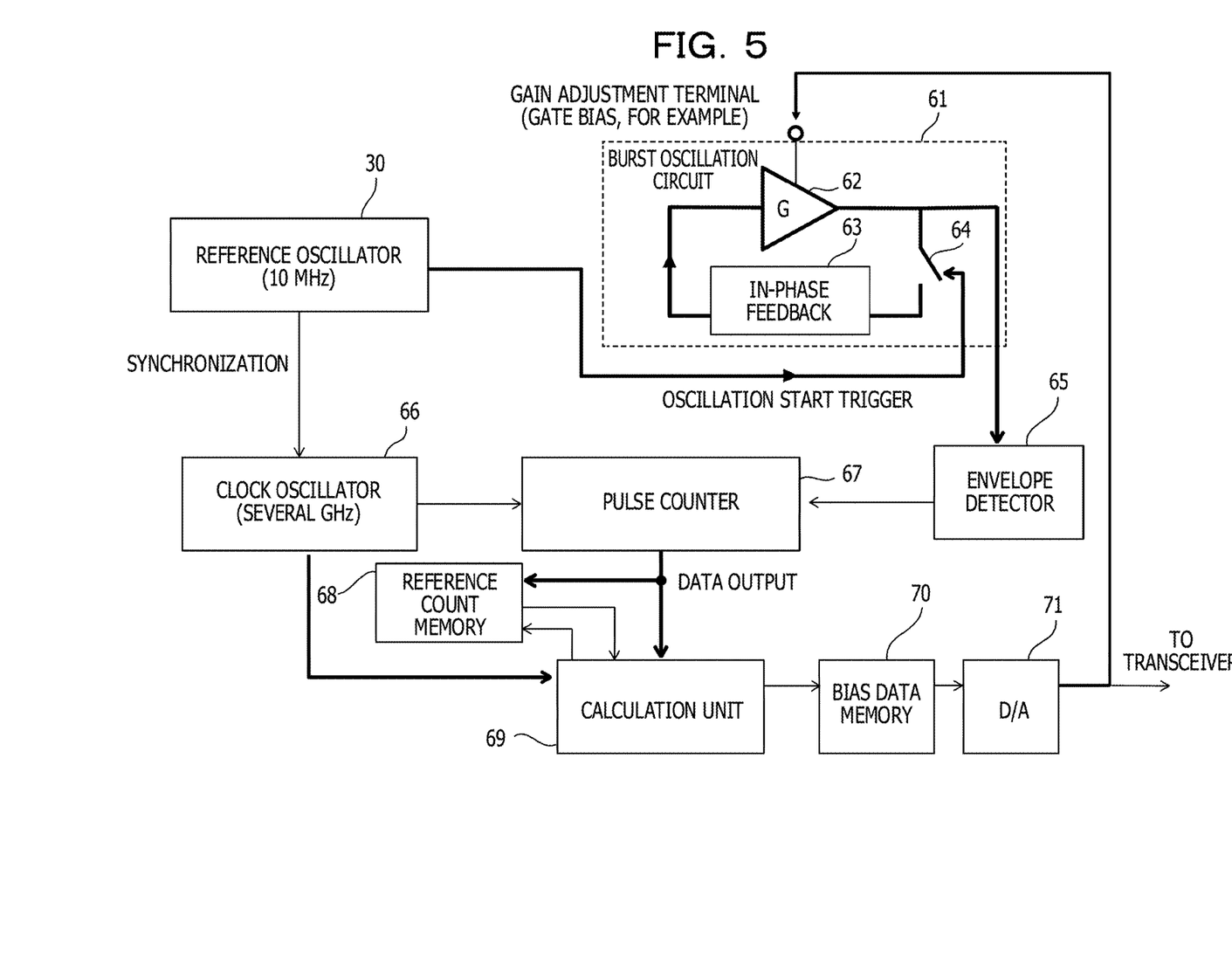
FIG. 5 illustrates an example of a temperature compensation circuit and a reference oscillator.

FIG. 5 illustrates an example of a temperature compensation circuit and a reference oscillator. The temperature compensation circuit 40 includes a burst oscillation circuit 61, an envelope detector 65, a clock oscillator 66, a pulse counter 67, a reference count memory 68, a calculation unit 69, a bias data memory 70, and a D/A converter 71.

The burst oscillation circuit 61 includes a replica amplifier (G) 62 of the transmission amplifier to be subjected to temperature compensation, an in-phase feedback path 63, and a switch 64 connected between the output of the replica amplifier 62 and the in-phase feedback path 63. The switch 64 is controlled by a reference oscillation signal of 10 MHz output from the reference oscillator 30, and is in a conductive state when the reference oscillation signal is at a high (H) level and in a cut-off state when the reference oscillation signal is at a low (L) level. The burst oscillation circuit 61 starts oscillation with a rise edge of the reference oscillation signal serving as an oscillation start trigger, oscillates while the reference oscillation signal is at the H level, and stops the oscillation when the reference oscillation signal is at the L level. The replica amplifier 62 may be a high-speed amplifier. An oscillation circuit may be formed with in-phase feedback, and the burst oscillation circuit 61 thus uses the in-phase feedback path 63. Explanations of other points are the same as those of FIG. 3 and thus omitted.

The envelope detector 65 receives an oscillation signal output from the burst oscillation circuit 61 and generates a signal indicating an envelope of the oscillation signal.

Figure 6:
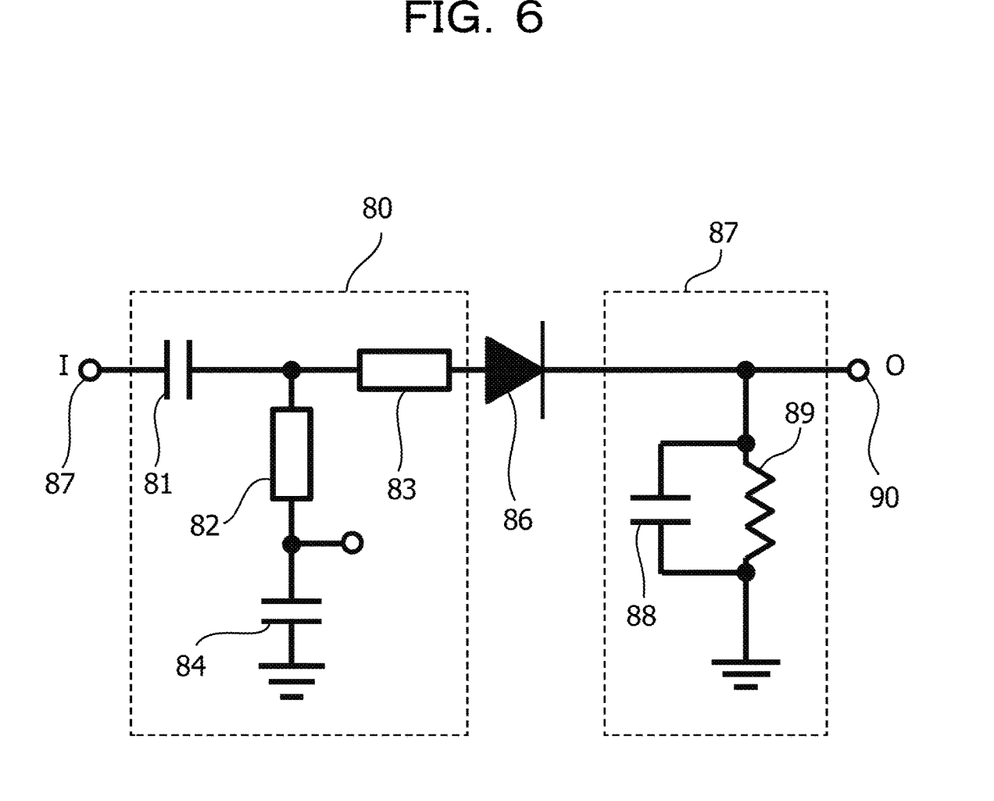
FIG. 6 illustrates an example of an envelope detector.

FIG. 6 illustrates an example of an envelope detector. The envelope detector 65 in FIG. 6 may be a diode detector. As the diode detector, a known circuit may be used. The envelope detector 65 includes an input matching circuit 80, a diode 86, and a low pass filter 87. The input matching circuit 80 includes a capacity element 81 and an impedance element 83, which are connected in series between an input terminal 87 and the diode 86. The input matching circuit 80 also includes an impedance element 82 and a capacity element 84, which are connected in series between a connection node of the capacity element 81 and the impedance element 83 and the ground. The input matching circuit 80 may be an impedance matching circuit that reduces reflections at the input terminal. As the impedance matching circuit, a known circuit may be used. The low pass filter 87 includes an impedance element 89 and a capacity element 88 connected in parallel among the diode 86, the output (an output terminal 90), and the ground. The low pass filter 87 allows only low-frequency components to pass therethrough. As the low pass filter 87, a known circuit may be used.

The clock oscillator 66 receives a reference oscillation signal from the reference oscillator 30, generates a clock multiplying the reference oscillation signal, and outputs the generated clock to the pulse counter 67 and the calculation unit 69. The clock oscillator 66 may include a PLL circuit, for example. The clock may be an oscillation signal of several GHz, for example. The clock is related to the measurement resolution of the rise time and desirably has a high frequency in view of increasing the resolution. However, when the frequency is high, it may be difficult to form the pulse counter 67. The clock may be set as appropriated in accordance with the design specification of the circuit. The clock supplied to the pulse counter 67 and the clock supplied to the calculation unit 69 may be the same clock. The frequency of the clock supplied to the calculation unit 69 may be smaller than that of the clock supplied to the pulse counter 67. The clock supplied from the clock oscillator 66 to the pulse counter 67 may be gated by the reference oscillation signal and supplied only while the reference oscillation signal is at a high level.

The pulse counter 67 starts counting of the clock from the rise edge of the reference oscillation signal and stops counting when the output from the envelope detector 65 reaches a predetermined level. From the rise edge of the reference oscillation signal, the burst oscillation circuit 61 starts oscillation, and the time taken until the amplitude (envelope) of the oscillation signal reaches a predetermined level is measured. The number of clocks counted until the envelope reaches a predetermined level from the start of the oscillation is output to the reference count memory 68 and the calculation unit 69 as a data output.

The reference count memory 68 includes a non-volatile memory such as a flash memory and stores therein a data output corresponding to the rise time measured under the reference conditions in accordance with an instruction from a calculation unit 69, for example. For storing the data output under the reference conditions, in the inspection at shipment, setting is performed such that a chip including the transmission amplifier 22 and the temperature compensation circuit 40 (or a circuit unit in the radar apparatus that includes these) is maintained under the reference conditions (for example, at a room temperature of 20° C.) and a desired output strength is obtained from the transmission amplifier 22. This setting may be performed by adjusting the gate bias, for example. The temperature compensation circuit 40 under such conditions measures the data output corresponding the rise time, and the calculation unit 69 instructs the reference count memory 68 to store therein the data output.

The bias data memory 70 retains data of the gate bias set by the calculation unit 69 and outputs the retained data to the D/A converter 71. The D/A converter 71 converts the data of the gate bias into a gate bias voltage and supplies the voltage thus obtained as the gate biases of the transistors included in the transmission amplifier 22 and the replica amplifier 62. The bias data memory 70 may be rewritable and a rewritable non-volatile memory such as a flash memory may be used as the bias data memory 70. The data of the gate bias written into the bias data memory 70 by the calculation unit 69 is retained until being rewritten into new data by the calculation unit 69, and the gate biases of the transistors included in the transmission amplifier 22 and the replica amplifier 62 are also maintained.

The calculation unit 69 may be a control circuit that operates in synchronization with the clock supplied from the clock oscillator 66 and may include a sequence circuit and a microcomputer. The calculation unit 69 may control the entire temperature compensation circuit 40. The calculation unit 69 sets the gate bias such that a desired output strength is obtained from the transmission amplifier 22 under reference conditions at shipment, and under those conditions, causes the reference count memory 68 to store therein the data output corresponding to the rise time of the burst oscillation circuit 61.

In a state in which the radar apparatus is operated, the calculation unit 69 receives the data output corresponding to the rise time (measured rise time) output from the pulse counter 67 and compares the received data output with the data output under the reference conditions stored in the reference count memory 68. When the data output corresponding to the measured rise time coincides with the data output under the reference conditions, the calculation unit 69 maintains the data of the gate bias set by the bias data memory 70 (rewriting is not performed). When the data output corresponding to the measured rise time is larger (longer) than the data output under the reference conditions, the calculation unit 69 increases the data of the gate bias set by the bias data memory 70 by one stage. When the data output corresponding to the measured rise time is smaller (shorter) than the data output under the reference conditions, the calculation unit 69 decreases the data of the gate bias set by the bias data memory 70 by one stage. With feedback control as described above, the data output corresponding to the measured rise time substantially in a state of coincidence with the data output under the reference conditions, and this state is maintained. At this time, the gain G of the replica amplifier 62 in the burst oscillation circuit 61 is substantially the same as that under the reference conditions, and the gain of the transmission amplifier 22 is also substantially the same as that under the reference conditions. From the transmission amplifier 22, a modulated high-frequency oscillation signal is output that has substantially the same strength as that under the reference conditions.

Figure 7:
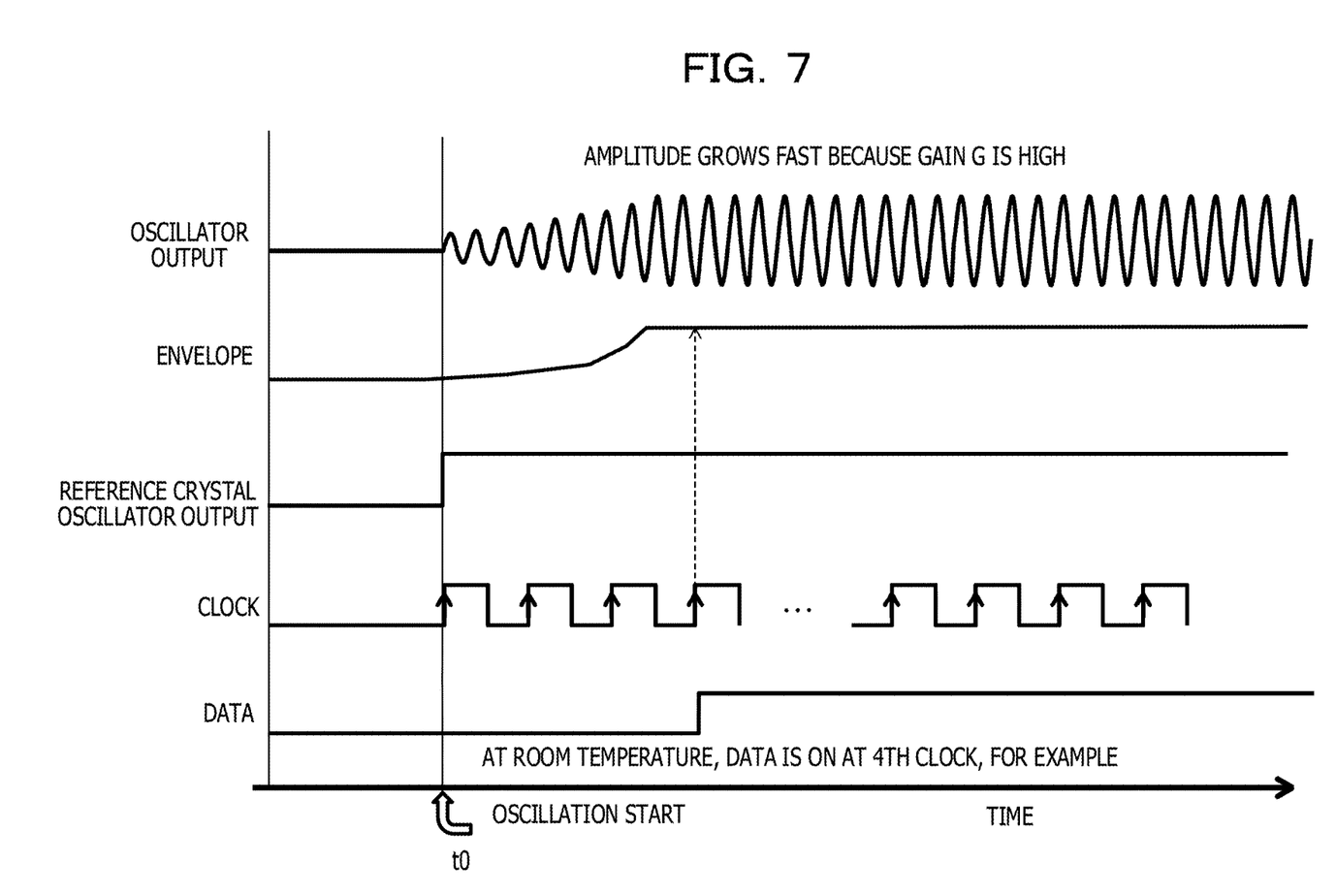
FIG. 7 illustrates an example of a timing diagram of an operation of the temperature compensation circuit at a room temperature.

FIG. 7 illustrates an example of a timing diagram of an operation of the temperature compensation circuit at a room temperature. In the inspection at shipment, the temperature compensation circuit is operated at a room temperature and performs an operation as illustrated in the timing diagram in FIG. 7. However, this operation in FIG. 7 may be performed also when the temperature compensation circuit is operated at a room temperature during normal operation.

FIG. 7 illustrates, from the top, an output from the burst oscillation circuit 61, an output (envelope) from the envelope detector 65, an output from the reference oscillator 30, a clock signal (clock) synchronized with a reference oscillation signal generated by the clock oscillator 66, and a signal indicating that a data output from the pulse counter 67 becomes effective. At a time t0, based on the rise edge of the output from the reference oscillator 30, the burst oscillation circuit 61 starts oscillation. As presented by the envelope, the amplitude gradually becomes large, and then reaches the normal amplitude. The speed at which the oscillation amplitude grows depends on the gain of the replica amplifier 62. The clock signal is a signal synchronized with the reference oscillation signal, and the time taken until a steady state is reached after the oscillation start at t0 is measured by counting clock signals. In FIG. 7, the steady state is reached at the 4th clock of the clock signal. At this timing, "data" which is a signal indicating the data output becomes effective rises from the L level to the H level.

In the inspection at shipment, upon detecting the rise of the data from the L level to the H level, the calculation unit 69 instructs the reference count memory 68 to store therein the data output at "the 4th clock" which is output by the pulse counter 67. The reference count memory 68 stores therein the data output in the inspection at shipment as reference gain information.

During normal operation at a room temperature, upon detecting the rise of the data from the L level to the H level, the calculation unit 69 reads the data output at "the 4th clock" which is output by the pulse counter 67. The calculation unit 69 reads the reference gain information (in this case, "the 4th clock") from the reference count memory 68. The calculation unit 69 then compares the two pieces of information thus read. The data output that has been output by the pulse counter 67 coincides with the reference gain information, and the calculation unit 69 thus does not perform setting of the gate bias for the bias data memory 70. With this, the gate bias value in the bias data memory 70 is maintained and the gate biases of the transmission amplifier 22 and the replica amplifier 62 are maintained.

Figure 8:
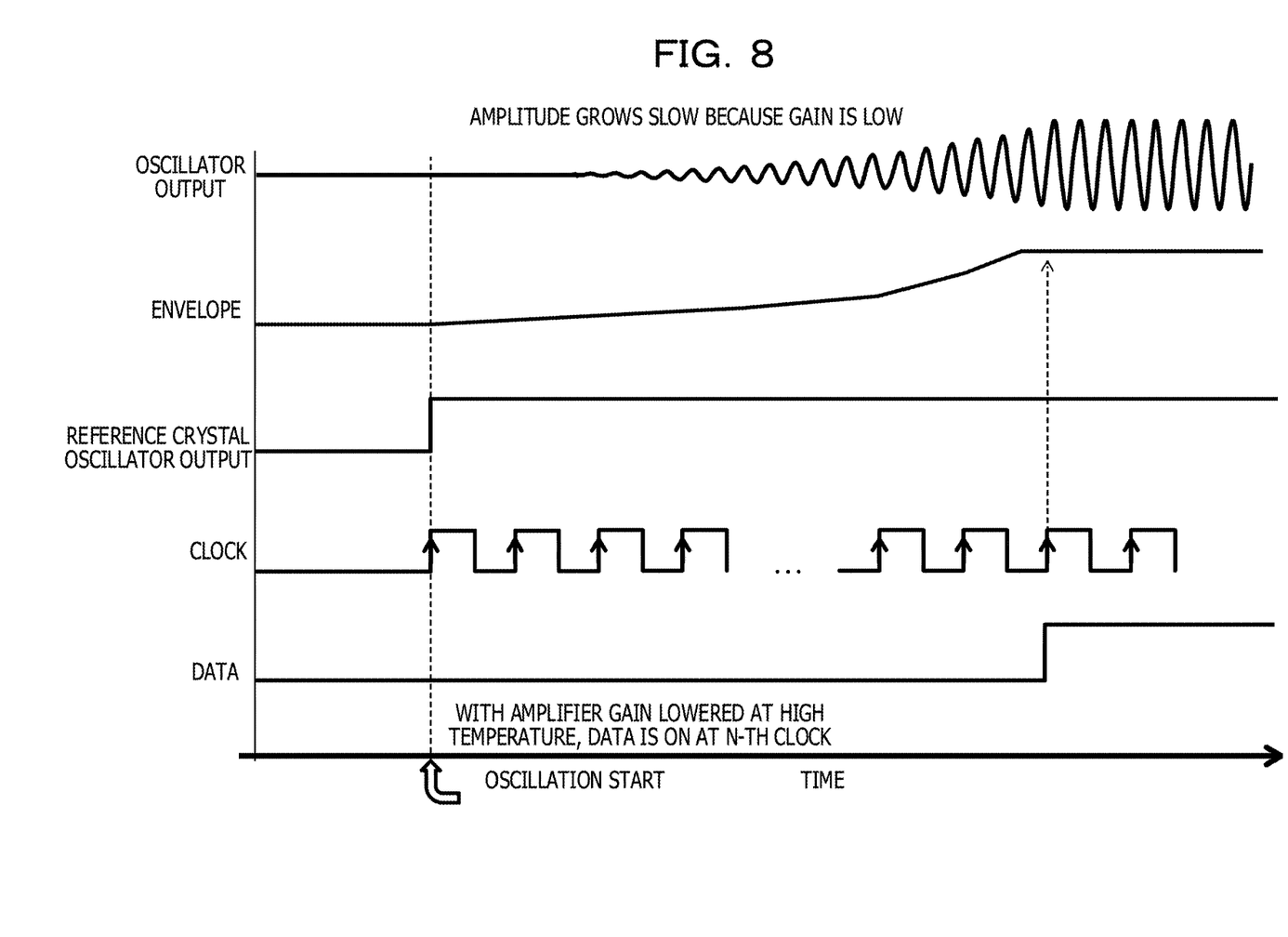
FIG. 8 illustrates an example of a timing diagram of an operation of the temperature compensation circuit at a high temperature.

FIG. 8 illustrates an example of a timing diagram of an operation of the temperature compensation circuit at a high temperature. In FIG. 8, the same signals as those illustrated in FIG. 7 are illustrated. However, because the gain of the amplifier is lowered at a high temperature, FIG. 8 is different from FIG. 7 in that the speed at which the oscillation amplitude grows is lower. With this, the time taken until the amplitude reaches the steady state is longer, and "data" which is the signal indicating the data output becomes effective rises from the L level to the H level at the Nth clock in FIG. 8. The difference (N−4) with the number of clock counts at a room temperature causes the lowering of the gain due to the temperature rise.

Figure 9:
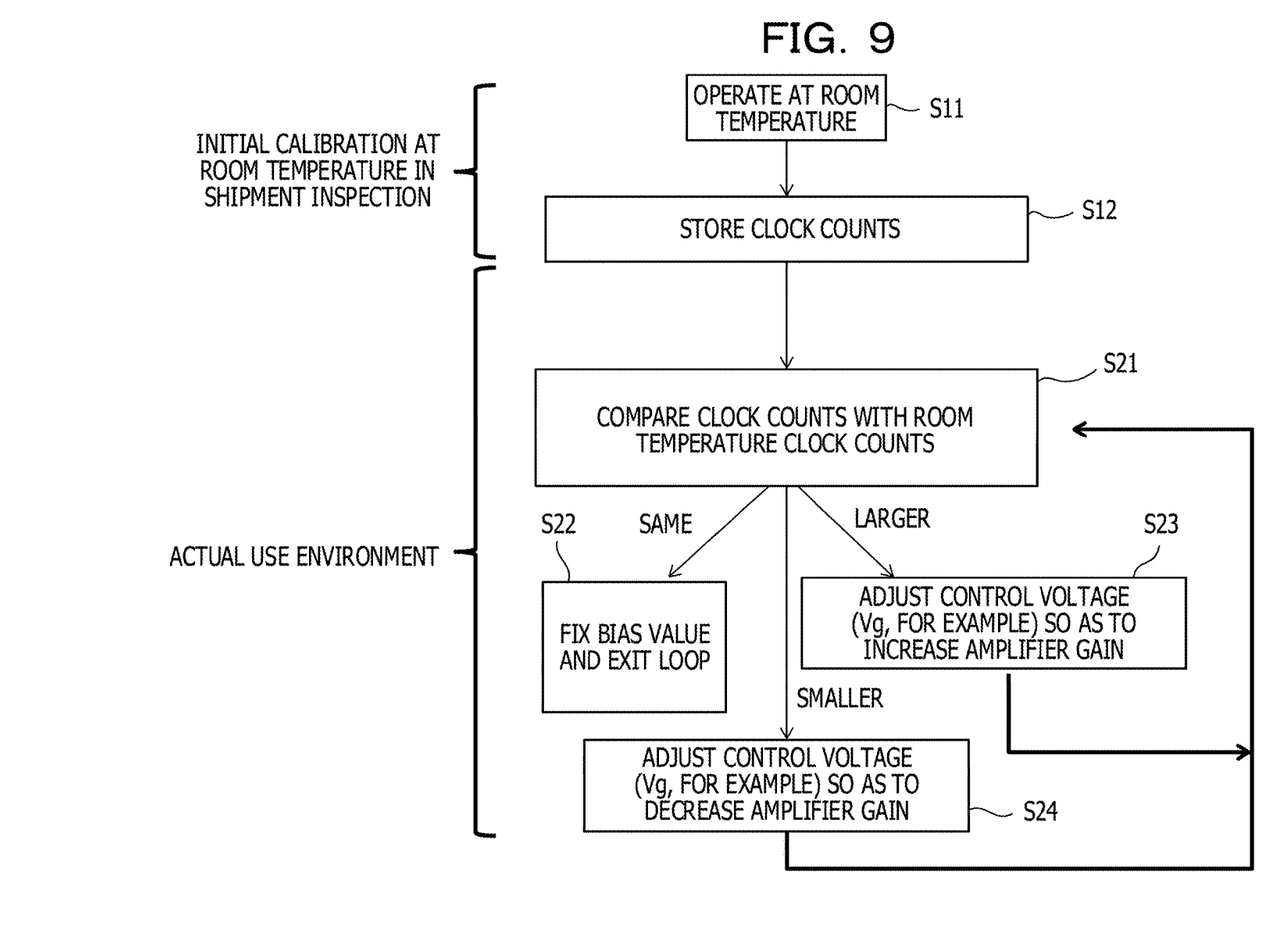
FIG. 9 illustrates an example of an adjustment operation of the temperature compensation circuit.

FIG. 9 illustrates an example of an adjustment operation of the temperature compensation circuit. In FIG. 9, operations S11 and S12 are initial calibration operations in the inspection at shipment at a room temperature, and operations S21 to S24 are setting operations performed during normal operation under an actual use environment.

At operation S11, a chip (radar apparatus) including a temperature compensation circuit is maintained at a room temperature and operated. At operation S12, an operation for measuring a rise time is performed, and the number of clock counts corresponding to the reference rise time is stored in the reference count memory 68 as reference gain information. This completes the processing for the inspection at shipment.

At operation S21, an operation for measuring a rise time is performed, and the measured number of clock counts is compared with the (reference) number of clock counts at a room temperature stored in the reference count memory 68. When the two pieces of information are the same, the processing proceeds to operation S22. When the measured number of clock counts is larger than the reference number of clock counts, the processing proceeds to operation S23. When the measured number of clock counts is smaller than the reference number of clock counts, the processing proceeds to operation S24.

At operation S22, the calculation unit 69 does not perform setting of the gate bias for the bias data memory 70. With this, the gate bias value in the bias data memory 70 is fixed, and the gate biases of the transmission amplifier 22 and the replica amplifier 62 are maintained. The processing exits from the adjustment operation loop.

When the measured number of clock counts is larger than the reference number of clock counts, it is indicated that the environmental temperature is higher than the room temperature. For this reason, at operation S23, the gate bias Vg is set high so that the gain of the amplifier is increased. For example, at operation S23, the calculation unit 69 increases data to be set to the bias data memory 70 by one stage. With this, the gate biases of the transmission amplifier 22 and the replica amplifier 62 are increased, and the gains of the transmission amplifier 22 and the replica amplifier 62 are increased. The processing then returns to operation S21. Thereafter, operations S21 and S23 are repeated until the measured number of the clock counts coincides with the reference number of clock counts.

When the measured number of clock counts is smaller than the reference number of clock counts, it is indicated that the environmental temperature is lower than the room temperature. For this reason, at operation S24, the gate bias Vg is set low so that the gain of the amplifier is decreased. For example, at operation S24, the calculation unit 69 decreases data to be set to the bias data memory 70 by one stage. With this, the gate biases of the transmission amplifier 22 and the replica amplifier 62 are decreased, and the gains of the transmission amplifier 22 and the replica amplifier 62 are decreased. The processing then returns to operation S21. Thereafter, operations S21 and S24 are repeated until the measured number of the clock counts coincides with the reference number of clock counts.

At operations S23 and S24, the operations are repeated until the measured number of clock counts coincides with the reference number of clock counts, and at a stage where the number of clock counts becomes the same as that at the room temperature, it is determined that the gain of the amplifier becomes the same value at the room temperature, and the processing exits from the loop.

The setting operations at operations S21 to S24 in FIG. 9, which are performed during normal operation, may be regularly performed, intermittently performed, or performed when the radar apparatus has detected a change in the environment.

Figure 10:
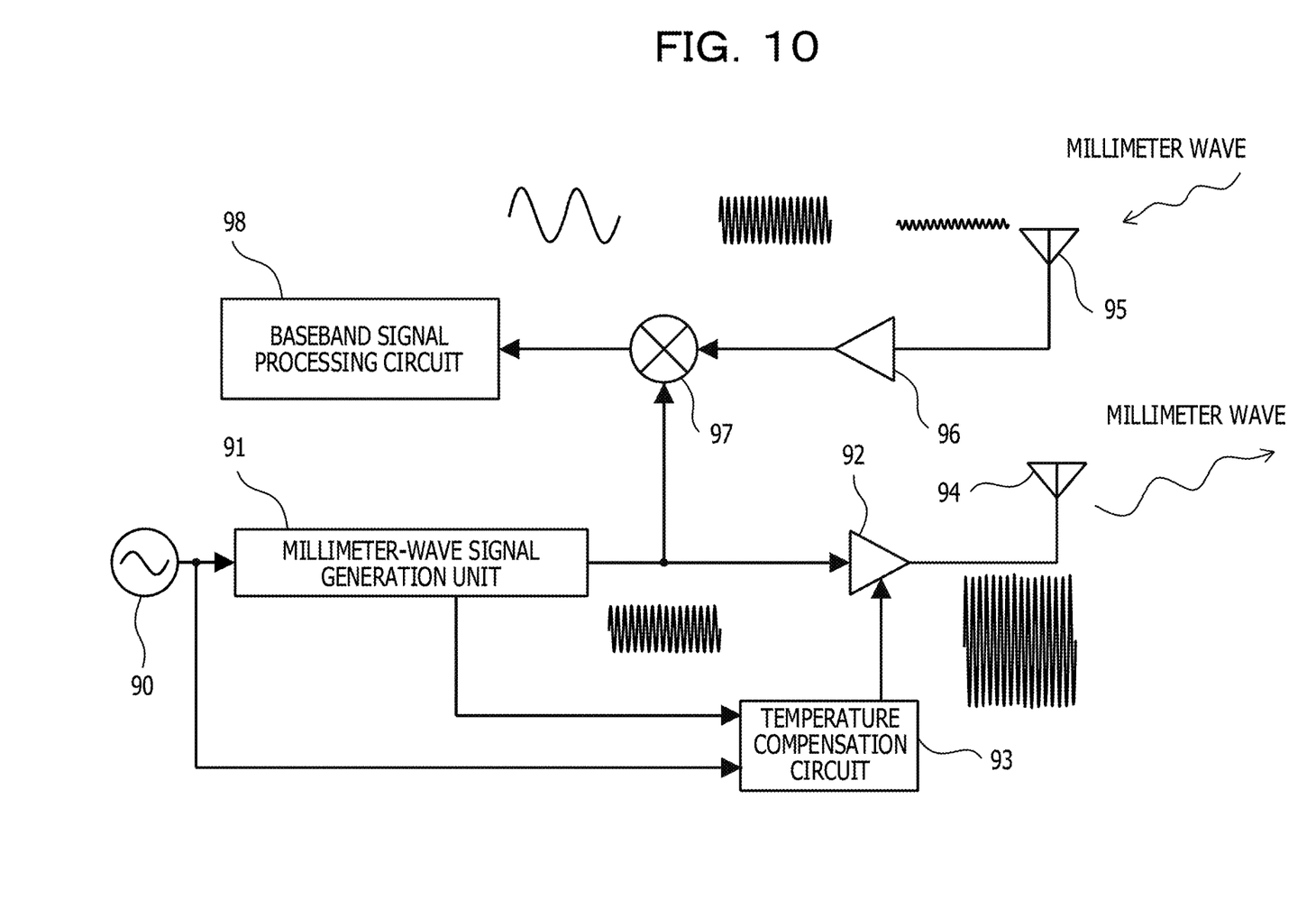
FIG. 10 illustrates an example of an FMCW radar apparatus.

FIG. 10 illustrates an example of an FMCW radar apparatus. In FIG. 10, when a transmission amplifier of an on-vehicle FMCW radar apparatus is to be subjected to compensation, the above-described temperature compensation circuit is applied to the FMCW radar apparatus.

The FMCW radar apparatus includes a reference signal source 90, a millimeter-wave signal generation unit 91, a transmission amplifier 92, a temperature compensation circuit 93, a transmission antenna 94, a reception antenna 95, a reception amplifier 96, a mixer 97, and a baseband signal processing circuit 98. The temperature compensation circuit 93 performs temperature compensation of the transmission amplifier 92. The FMCW radar apparatus uses a millimeter-wave signal as a radio signal (high-frequency signal).

The reference signal source 90 includes a crystal oscillator, for example, and outputs a reference signal at a fixed frequency (for example, 10 MHz). The millimeter-wave signal generation unit 91 includes a variable frequency oscillation circuit that oscillates at several tens of GHz and a feedback control circuit that performs feedback control of the variable frequency oscillation circuit such that an oscillation signal output from the variable frequency oscillation circuit has a predetermined relationship with the reference signal. The variable frequency oscillation circuit may include a voltage control oscillator (VCO) and a current-controlled oscillator (ICO), for example. The feedback control circuit may include a PLL circuit that frequency-divides the oscillation signal output from the variable frequency oscillator circuit, detects a phase difference between the obtained frequency-divided signal and the reference signal, and applies a control signal generated by cutting the high-frequency components of the phase difference signal to the variable frequency oscillation circuit. The feedback control circuit may include an FLL circuit that detects a frequency difference between the frequency-divided signal and the reference signal and feedbacks the detected difference. In a manner described above, a local signal generation circuit 11 has a predetermined relationship with the reference signal and generates a local signal modulated in accordance with the transmission data.

The FMCW radar apparatus uses a millimeter-wave signal as a radio signal, and the millimeter-wave signal may correspond to the high-frequency signal (local signal) described above. The local signal is generated at an unstable high-frequency oscillator such as a VCO, and compared with a highly stable reference signal and receives feedback control, whereby the frequency of the local signal is stabilized. As a feedback control mechanism as described above, PLL or FLL may be used.

The transmission amplifier 92 amplifies the local signal. The amplified local signal is output from the transmission antenna 94. The reception antenna 95 receives a high-frequency signal corresponding to the local signal. The high-frequency signal is amplified by the reception amplifier 96. The mixer 97 mixes the high-frequency signal amplified by the reception amplifier 96 and the local signal to generate an intermediate frequency (IF) signal. The baseband signal processing circuit 98 digital-converts the intermediate frequency signal, performs digital processing on the digital-converted signal, and acquires the reception data, for example.

For example, an on-vehicle millimeter-wave radar transmits an FMCW-modulated signal, receives a reflected signal, extracts a Doppler component in the intermediate frequency signal, and detects the distance from the object and the relative speed. In this case, the local signal generation circuit 91 outputs a local signal the frequency of which repeats linear change between the upper limit and the lower limit.

As the FMCW radar apparatus, a known apparatus may be employed.

The temperature compensation circuit 93 may be a temperature compensation circuit according to the embodiment illustrated in FIG. 5. However, the temperature compensation circuit 93 does not include the reference oscillator 30 or the clock oscillator 66. As a reference oscillator signal, an oscillation signal supplied from the reference signal source 90 may be used. As a clock, an oscillation signal obtained by frequency-dividing a high-speed oscillation signal generated by the millimeter-wave signal generation unit 91 may be used. With this configuration, the temperature compensation circuit 93 may have a smaller circuit scale because the reference oscillator 30 and the clock oscillator 66 illustrated in FIG. 5 are not provided.

In the radar apparatus illustrated in FIG. 10, in order to reduce the power consumption in the temperature compensation circuit 93, the temperature compensation circuit 93 is operated intermittently. With respect to this radar apparatus, in the inspection at shipment, operations S11 and S12 illustrated in FIG. 9 have been performed and the reference numbers of clock counts are stored therein.

Figure 11:
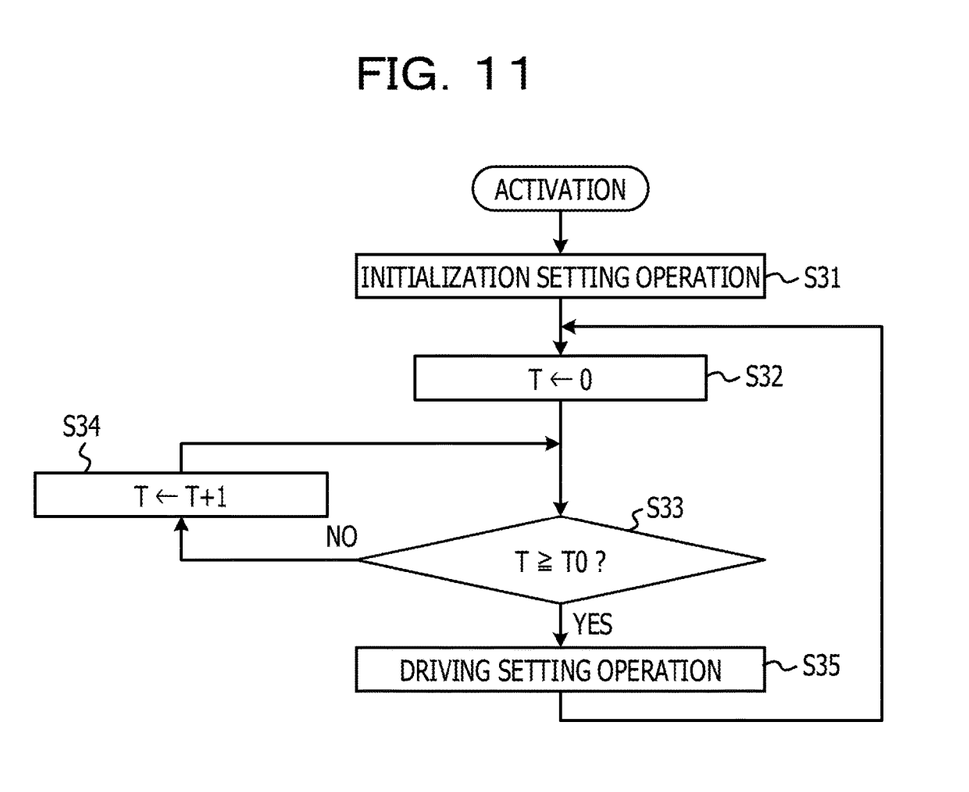
FIG. 11 illustrates an example of an intermittent operation of the temperature compensation circuit during normal operation.

FIG. 11 illustrates an example of an intermittent operation of the temperature compensation circuit during normal operation. The intermittent operation of the temperature compensation circuit illustrated in FIG. 11 may be controlled by a control unit of the radar apparatus, for example.

Operation S31 is performed when the engine of the vehicle is activated and the power supply of the radar apparatus is turned on. The temperature compensation circuit is operated and an initialization setting operation is performed. The duration for which the initialization setting operation is performed may be set as appropriate in accordance with the time taken until the temperature of the part on which the radar apparatus is mounted becomes stable after the engine activation (for example, about 10 minutes). The initialization setting operation performed at operation S31 may be operations S21 to S24 illustrated in FIG. 9. Once the initialization setting operation has been completed, the temperature compensation circuit is turned off.

At operation S32, a parameter T representing the time interval of the intermittent operation is set to zero. At operation S33, it is determined whether the parameter T is equal to or larger than a predetermined value T0. When T is smaller than T0, the processing proceeds to operation S34, and when T is larger than or equal to T0, the processing proceeds to operation S35.

At operation S34, T is increased by 1, and the processing returns to operation S33. Until the parameter T becomes T0 or larger, operations S33 and S34 are repeated. Until the time interval corresponding to T0 has elapsed, the temperature compensation circuit is in a waiting state.

At operation S35, the temperature compensation circuit is turned on, and a driving setting operation corresponding to operations S21 to S24 illustrated in FIG. 9 is performed. Once the driving setting operation has been completed, the temperature compensation circuit is turned off and the processing returns to operation S32.

With operations S31 to S35 performed, the initialization setting operation is performed when the radar apparatus is activated. Thereafter, the driving setting operation is performed at the time interval corresponding to T0. When no setting operation is performed, the temperature compensation circuit is turned off, whereby the power consumption is reduced. The value of T0 corresponding to the time interval during the intermittent operation is set as appropriate with consideration for the use environment of the radar apparatus, the acceptable variation range of radio waves for radar, the stability of the transmission amplifier, for example.

The above-described temperature compensation circuit may be applied to an FMCW radar apparatus or other wireless devices, for example. The temperature compensation circuit may be applied to a device that is not a wireless device as long as the device is a circuit having an amplifier that amplifies a high-frequency signal.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A temperature compensation circuit comprising:
   an oscillation circuit configured to include a replica amplifier of a target amplifier to be subjected to temperature compensation and oscillate by feeding an output of the replica amplifier back to an input;
   a time measurement circuit configured to measure a measured rise time taken from a start of oscillation of the oscillation circuit until an amplitude of an oscillation signal reaches a specific amplitude in the oscillation circuit; and
   a control circuit configured to compare a reference rise time of the oscillation circuit measured under a reference condition and the measured rise time and change a driving condition of the replica amplifier such that the measured rise time becomes substantially equal to the reference rise time.

2. The temperature compensation circuit according to claim 1,
   wherein a driving condition of the target amplifier is set based on a driving condition at the time of convergence.

3. The temperature compensation circuit according to claim 1,
   wherein an oscillation frequency of the oscillation circuit is changed based on a change of the driving condition of the replica amplifier.

4. The temperature compensation circuit according to claim 1,
   wherein the driving condition includes a gate bias voltage of a transistor included in the replica amplifier.

5. The temperature compensation circuit according to claim 1,
   wherein the time measurement circuit includes:
   a clock oscillator configured to output a clock;
   an envelope detector of the oscillation signal; and
   a pulse counter configured to count the clock during a time form the start of oscillation of the oscillation circuit until an output of the envelope detector reaches a specific level.

6. The temperature compensation circuit according to claim 5,
   wherein a count number of the pulse counter is output as the measured rise time.

7. The temperature compensation circuit according to claim 6,
   wherein the reference rise time is a reference count number that corresponds to a rise time of the oscillation circuit which is measured at a room temperature.

8. The temperature compensation circuit according to claim 1,
wherein the control circuit adjusts a gate bias of a transistor included in the replica amplifier such that a gain of the replica amplifier is increased when the measured rise time is longer than the reference rise time, and a gain of the replica amplifier is decreased when the measured rise time is shorter than the reference rise time.

9. A radar apparatus comprising:
a reference oscillation source configured to output a reference oscillation signal;
a transmission signal generation circuit configured to be synchronized with the reference oscillation signal, generate a transmission oscillation signal with a frequency higher than a frequency of the reference oscillation signal, and modulate the transmission oscillation signal to generate a transmission signal;
a transmission amplifier configured to amplify the transmission signal;
a gain adjustment circuit configured to adjust a gain of the transmission amplifier; and
a transmission antenna configured to transmit the transmission signal that is amplified,
wherein the gain adjustment circuit includes:
an oscillation circuit configured to include a replica amplifier of the transmission amplifier and oscillate by feeding an output of the replica amplifier back to an input,
a time measurement circuit configured to measure a measured rise time taken from a start of oscillation of the oscillation circuit until an amplitude of an oscillation signal reaches a specific amplitude in the oscillation circuit, and
a control circuit configured to compare a reference rise time of the oscillation circuit measured under a reference condition and the measured rise time and change a driving condition of the replica amplifier such that the measured rise time becomes substantially equal to the reference rise time.

10. The radar apparatus according to claim 9,
wherein the gain adjustment circuit:
includes a storing unit configured to hold a driving condition of the transmission amplifier;
performs, at a time of activation, an initialization setting operation for setting the driving condition of the transmission amplifier; and
performs, during operation, a driving setting operation for intermittently setting a driving condition of the transmission amplifier.

11. The radar apparatus according to claim 9, further comprising:
a reception antenna configured to receive a reflected wave of the transmission signal;
a reception amplifier configured to amplify a reception signal output from the reception antenna and output the amplified reception signal;
a mixer configured to mix the transmission signal with the amplified reception signal; and
a baseband signal processing circuit configured to process an intermediate frequency signal output from the mixer.

12. The radar apparatus according to claim 9,
wherein a driving condition of the transmission amplifier is set based on a driving condition at the time of convergence.

13. The radar apparatus according to claim 9,
wherein an oscillation frequency of the oscillation circuit is changed based on a change of the driving condition of the replica amplifier.

14. The radar apparatus according to claim 9,
wherein the driving condition includes a gate bias voltage of a transistor included in the replica amplifier.

15. The radar apparatus according to claim 9,
wherein the time measurement circuit includes:
a clock oscillator configured to output a clock;
an envelope detector of the oscillation signal; and
a pulse counter configured to count the clock during a time form the start of oscillation of the oscillation circuit until an output of the envelope detector reaches a specific level.

16. The radar apparatus according to claim 15,
wherein a count number of the pulse counter is output as the measured rise time.

17. The radar apparatus according to claim 16,
wherein the reference rise time is a reference count number that corresponds to a rise time of the oscillation circuit which is measured at a room temperature.

18. The radar apparatus according to claim 9,
wherein the control circuit adjusts a gate bias of a transistor included in the replica amplifier such that a gain of the replica amplifier is increased when the measured rise time is longer than the reference rise time, and a gain of the replica amplifier is decreased when the measured rise time is shorter than the reference rise time.

* * * * *